June 16, 1959 R. W. BRADMILLER 2,891,145
DETECTOR AND AGC SYSTEM
Filed Dec. 5, 1956
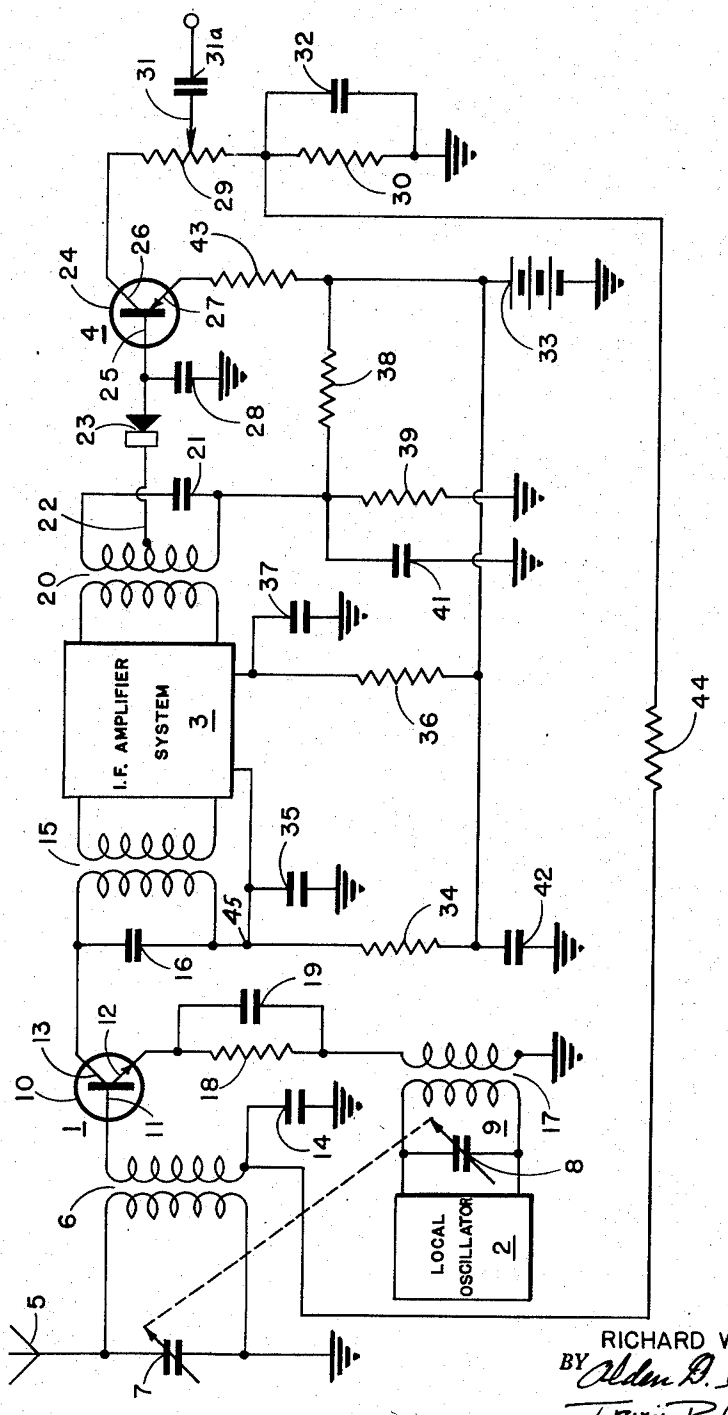
INVENTOR.
RICHARD W. BRADMILLER
BY Alden D. Redfield
Irwin P. Garfinkle
ATTORNEYS.

United States Patent Office 2,891,145

Patented June 16, 1959

2,891,145

DETECTOR AND AGC SYSTEM

Richard W. Bradmiller, Cincinnati, Ohio, assignor to Avco Manufacturing Corporation, Cincinnati, Ohio, a corporation of Delaware Application December 5, 1956, Serial No. 626,485

5 Claims. (Cl. 250—20)

This invention relates to detection circuits generally, and more particularly to power detectors employed as demodulators in transistor receiver systems.

In the receiver art, it is known that the detector diode must have a high impedance load which is isolated from variations in the audio and automatic gain control circuits; otherwise changes in load in these circuits will produce distortion in the diode output. Many systems for producing a high and isolated diode load impedance are known in the prior art, but the known systems are complicated, cumbersome and not peculiarly adapted to transistor amplifier characteristics. The use of transformer coupling is most frequently found in the prior art, but transformers are large, heavy, expensive, and not readily adaptable for miniaturization.

The object of this invention is to provide a receiver using a transistor detector system which will be in the simplest and most efficient form, and which will produce (1) distortion-free low level signal detection, (2) distortion-free high percentage modulation detection, (3) transformerless audio circuitry, (4) one or two orders of AGC control power more than is usually available from a simple diode detector, and (5) demodulation process unaffected by varying audio or AGC loads.

Another object of this invention is to provide a power detector having a load impedance which is isolated from varying audio and AGC loads and which includes an emitter follower circuit as a diode load.

In detection circuits employing a vacuum tube in the output of a diode, the diode load impedance is high since the input of a vacuum tube is very high. On the other hand, the output impedance of a diode in a transistor detector circuit is usually low since the input impedance of the following transistor audio stage is very low. In order that the diodes used in transistor detector circuits operate most efficiently and within minimum distortion, it is desirable that they be provided with a high load impedance as in vacuum tube circuits, and also that the diode load impedance be constant. This result has been accomplished by means of this invention which provides a diode load circuit comprising an emitter follower transistor having a high impedance input, and an A.C. and D.C. load circuit which is isolated from the input circuit.

A more complete understanding of my invention may be had from a study of the following detailed description of a specific embodiment of my invention which is illustrated in the drawing to which reference is now made.

The single figure is a simplified schematic representation of a transistorized superheterodyne radio receiver which includes the diode detector and automatic gain control circuits embodying my invention. The system includes a mixer stage 1, a local oscillator stage 2, an intermediate frequency stage 3 and an audio frequency stage 4, which includes my novel detector and automatic gain control circuits.

The mixer 1, the oscillator 2, and the I.F. stage 3 are conventional. Transmitted radio frequency signals are received at antenna 5 and are transformer-coupled through a variable tuned transformer 6 to the input of the mixer circuit. The transformer 6 is tuned by means of a variable condenser 7 which may be ganged in the usual manner with the tuning condenser 8, in the resonant tank circuit 9 of the local oscillator 2. The R.F. mixer comprises a three-element transistor 10 having a base 11, an emitter 12, and a collector 13. The transistor may be connected for common emitter operation—i.e., the emitter 12 is common to the input circuit between the electrodes of the base 11 and emitter 12, and to the output circuit between the electrodes of the collector 13 and emitter 12 electrodes. The input circuit to the transistor 10 includes the secondary of the tuned transformer 6 which is grounded through a condenser 14, while the output circuit includes a transformer 15, tuned to the intermediate frequency by means of a condenser 16. The output from the local oscillator 2, shown for convenience in block form, is applied to the emitter 12 from a transformer 17, tuned by the variable condenser 8, and through an emitter resistance 18, by-passed by a condenser 19. In the conventional manner, the heterodyning of the local oscillator signal with the received radio frequency signal produces signals in the collector circuit which contain components of both signals and the sum and difference thereof. The transformer is resonant at the intermediate frequency, usually the difference frequency, which is then applied to the intermediate frequency stage for amplification.

For convenience, the I.F. stage 3 is shown in block form, and depending on circuit requirements it may be a single or multiple stage amplifier. Any conventional amplifier system such as those usually found in broadcast receivers may be used.

The output from the I.F. stage 3 is applied to a high impedance transformer 20, having a secondary winding tuned with a condenser 21 and tapped at 22. The transformer output is taken from the tap 22 and applied to a diode detector 23. The diode load comprises audio frequency transistor amplifier 24 having a base 25, a collector 26, and a common emitter 27. A condenser 28 is used to provide the proper time constant in the detector circuit. The input to transistor amplifier 24 is taken from diode 23 and applied between the base 25 and the common emitter 27. The output of transistor 24 is taken from across an A.C. audio load resistor 29 and a D.C. automatic gain control resistor 30 in the circuit of collector 26. The A.C. load may be taken off the audio load resistor 29 by means of a variable tap 31 which provides volume control. The output may be coupled to a speaker or another stage of audio amplification (not shown) by means of a condenser 31*a*. The D.C. automatic gain control resistor 30 is provided with an A.C. by-pass condenser 32.

Each of the stages is appropriately biased by means of a battery 33 or other suitable direct current source. The transistor 10 is supplied with the necessary bias through a resistor 34, by-passed by a condenser 35, while in the intermediate stage 3, shown in block form, the transistors are conductively biased through a resistor 36, by-passed by a condenser 37. The biasing arrangement for audio stage transistor and the detection diode is a feature of this invention, and it includes the resistors 38 and 39 connected across the battery 33, and the by-pass condensers 41 and 42. The resistor 43 is connected in the emitter circuit between the battery 24 and the terminal of the emitter 27 to provide a degenerative network for the transistor 24. In operation, the D.C.

bias developed by the diode 23 during rectification increases the current in the transistor and thus allows the transistor to handle more signal power when more signal power is delivered to the diode.

A source of automatic gain control voltage is taken from across the automatic gain control resistor 30 and may be applied to the base 11 of the mixer transistor 10 through the secondary of transformer 6 and a resistor 44. Although provision is made in the drawing for gain control power applied only to the mixer stage 1, the same source at the automatic gain control resistor 30 may also be used to supply any gain control system whose power demands do not exceed that delivered from the gain control load resistor. This is made possible because of the power amplification in the audio amplifier transistor 24. Moreover, since this circuit permits high automatic gain control power, second sources of automatic gain control will be available in other parts of the circuit. A convenient source is available at point 45 at the resistor 34 which comprises the D.C. output of the mixer stage 1. This source can be conveniently coupled into the input of the I.F. stage in any convenient manner, or into any other appropriate circuit in the system.

Since the input for the diode 23 is from a parallel resonant circuit comprising the secondary of transformer 20 and condenser 21, the diode is driven from a high impedance network as required for efficient operation. In addition, in order to achieve good rectifying efficiency and high modulation handling capabilities, a high and constant output impedance is also required. The required output load for the diode has been provided by employing the degenerative emitter resistor 43 in the emitter follower circuit of the transistor 24, and in placing both the A.C. output load resistor 29 and the D.C. automatic gain control load resistor 30 in the collector circuit. The emitter resistor 43 provides high transistor input impedance in a manner familiar to the art and since the audio load resistor 29 and the automatic gain control load 30 are both located in the collector circuit, load variations in neither the audio circuit nor the gain control circuit affect the high impedance input of the transistor which comprises the load for the diode. Thus, to satisfy the requirement that the diode be provided with a high impedance load, the high input impedance of an emitter follower transistor has been employed. To satisfy the requirement that the high impedance load be constant, the circuits subject to variations, i.e., the A.C. load circuit for driving a speaker or another stage of audio amplification and the D.C. automatic gain control load have been isolated from the emitter. Thus, the degenerative high impedance emitter circuit provides a load circuit which is both high and constant.

In order to avoid low level distortion and to increase sensitivity, the diode is biased slightly in a conduction direction. This bias is provided by means of the biasing network comprising the resistors 38 and 39 connected across the battery 33, and the condensers 41 and 42.

Thus, in accordance with this invention I have produced a diode power detector with an A.C. and a D.C. amplifier. The input for the amplifier comprises the detector load, and with the use of an emitter follower configuration in the amplifier, the diode load impedance is high. The diode detector impedance is made constant by the placing of both the A.C. and D.C. loads in the collector circuit where variations will not affect the diode load. Furthermore, low level signals are undistorted because of the diode biasing arrangement which is provided in combination with the transistor circuits.

While the disclosed embodiment is presently considered to be a preferred form of my invention, it will be understood by those skilled in the art that various modifications and changes may be made in accordance with the spirit and scope of the invention as defined by the appended claims.

What I claim is:

1. In a detector system, the combination comprising: a semi-conductor diode; a high impedance input circuit for said diode, said high impedance input circuit including a source of carrier frequencies having signal frequencies modulated thereon; a high and constant load for said diode, said load comprising a transistor having base, emitter and collector electrodes, a source of direct voltage having a positive and a negative terminal, means connecting one terminal of said direct voltage source to said emitter electrode through an emitter load for biasing said emitter in a forward direction, said emitter load comprising a high impedance for signal frequencies and for direct current, and means connecting the other of said terminals of said direct voltage source to said collector electrode through first and second collector loads for biasing said collector in a reverse direction, said first collector load comprising a high impedance for signal frequencies and for direct currents, said second collector load being bypassed for signal frequencies and constituting a source of automatic gain control; said diode being connected in series with said base and emitter electrodes, said emitter load, said direct voltage source and said source of carrier frequencies.

2. The combination comprising: a detector having an input terminal and an output terminal; a high impedance input circuit connected between said input terminal and a point of reference potential, said high impedance input circuit including a source of carrier frequencies having signal frequencies modulated thereon; a detector load connected between said output terminal and said point of reference potential, said detector load comprising a transistor having base, emitter and collector electrodes; an emitter load connected in series with said emitter and base electrodes between said output terminal and said point of reference potential, said emitter load comprising a high impedance for signal frequencies and for direct currents; first and second series connected collector loads connected between said collector electrode and said point of reference potetnial, said first collector load comprising a high impedance for signal frequencies and for direct currents, said second collector load being bypassed for audio frequencies and constituting a source of automatic gain control; and means biasing said electrodes for transistor operation.

3. The invention as defined in claim 2 wherein said detector comprises a diode.

4. The invention as defined in claim 2 wherein are included means for biasing said diode slightly in the conducting direction.

5. In a superheterodyne receiver system having a mixer, a local oscillator, an intermediate frequency amplifier, a detector system and an audio frequency amplifier, the combination comprising: a diode rectifier in said detector system, said diode having input terminals and output terminals and being biased in a slightly conducting direction; a condenser connected across said output terminals for providing a proper time constant for said diode rectifier; said audio frequency amplifier having an input circuit connected across said output terminals and constituting a high and constant impedance load for said diode rectifier, said audio frequency amplifier comprising a transistor having a base, an emitter and a collector and having its input circuit connected between said base and emitter and having its output circuit connected between said collector and emitter, said input circuit including a high impedance resistor in series with said emitter and said base, said output circuit including an audio frequency load and an automatic gain control load connected in series with said collector; means coupling said output terminals of said diode across said input circuit of said audio frequency amplifier; means for operatively biasing said transistor; and means for connecting said automatic gain control load to said mixer stage.

References Cited in the file of this patent

UNITED STATES PATENTS 2,807,718 Chressanthis et al. ------- Sept. 24, 1957

OTHER REFERENCES

IRE Transactions on Broadcast and Television Receivers, April 1956, by J. A. Worcester (pages 6–9).

RCA Technical Notes No. 30, received U.S. Patent Office, August 9, 1957.